(12) United States Patent
Zeng et al.

(10) Patent No.: US 6,522,180 B1
(45) Date of Patent: Feb. 18, 2003

(54) BI-VOLTAGE LEVELS SWITCHES

(75) Inventors: Raymond Zeng, Folsom, CA (US); Bo Li, Folsom, CA (US); Mase Taub, Elk Grove, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/745,970

(22) Filed: Dec. 21, 2000

(51) Int. Cl.$^7$ ................................................. H03K 3/00
(52) U.S. Cl. ........................................ 327/112; 327/108
(58) Field of Search ................................ 327/108, 109, 327/111, 112, 333, 170; 326/83, 86

(56) References Cited

U.S. PATENT DOCUMENTS

| | | | | |
|---|---|---|---|---|
| 5,017,807 A | * | 5/1991 | Kriz et al. ...................... 326/83 |
| 5,216,293 A | * | 6/1993 | Sei et al. ........................ 326/83 |
| 5,414,379 A | * | 5/1995 | Kwon ........................... 327/170 |
| 5,497,105 A | * | 3/1996 | Oh et al. ....................... 326/83 |
| 5,543,744 A | * | 8/1996 | Okumura ...................... 327/333 |
| 5,568,081 A | * | 10/1996 | Lui et al. ...................... 327/170 |
| 5,923,192 A | * | 7/1999 | Hasegawa ..................... 327/112 |
| 6,054,876 A | * | 4/2000 | Horie et al. .................. 326/112 |
| 6,163,177 A | * | 12/2000 | Hara et al. ................... 327/108 |
| 6,323,704 B1 | * | 11/2001 | Pelley et al. ................. 327/112 |
| 6,329,840 B1 | * | 12/2001 | Moyal .......................... 326/57 |

OTHER PUBLICATIONS

Giogio Rizzoni, Principles and Applications of Electrical Engineering, Chapter 8, pp. 429–431, 1996, $2^{nd}$ Edition, Tom Casson, United States.

* cited by examiner

*Primary Examiner*—Toan Tran
(74) *Attorney, Agent, or Firm*—Peter Lam

(57) ABSTRACT

An apparatus to provide a novel bi-voltage level switching. The apparatus includes a first level shifting buffer coupled to a voltage supply, an input, and a first transistor. The first transistor coupled to the voltage supply and an output. A second level shifting buffer coupled to the voltage supply, the input and second transistor. The second transistor coupled to the output and a voltage source.

39 Claims, 7 Drawing Sheets

US 6,522,180 B1

BI-VOLTAGE LEVELS SWITCHES

FIELD OF INVENTION

The present invention relates generally to voltage switches. More particularly, the present invention relates to an apparatus to provide novel bi-voltage level switching.

BACKGROUND OF THE INVENTION

A back-to-back voltage switch is a device that switches between two different input voltages to produce an output voltage. Back-to-back voltage switches are used in high voltage circuit environments where initialization devices in a voltage pump need high voltage input to initialize the internal pump nodes. Back-to-back switches are also used in circuit applications that require switching between two different voltages, where one voltage needs to be isolated from the other voltage.

Prior art uses two back-to-back switches to accomplish voltage switching between two different voltages. The back-to-back switches used by prior art consists of four level shifter, four NMOS transistors and four PMOS transistors coupled together.

A problem with this approach is that a large amount of Read-While-Write (RWW) products used in the market today require simple layouts with minimal circuitry. Prior art methods for voltage switching include complex circuits with several electronic components that occupy a large amount of layout space.

Another problem with using a four level shifter is that level shifter contain significant internal resistance drops. A voltage signal passing through the prior art device using four level shifter is subject to several voltage potential losses due to these internal resistance drops. Thus the voltage signal becomes weak, inefficient, and looses its power. Power and efficiency loss in a voltage signal result in a low performance circuit.

BRIEF DESCRIPTION OF THE DRAWINGS

The features and advantages of the present invention are illustrated by way of example and not intended to be limited by the figures of the accompanying drawings in which like references indicate similar elements and in which.

DETAILED DESCRIPTION

An apparatus to provide novel bi-voltage level switching is described. The apparatus is a novel bi-voltage level switching circuit that includes a first level shifting buffer coupled to a voltage supply, input, and a first transistor. The first transistor coupled to the voltage supply and an output. A second level shifting buffer coupled to the voltage supply, the input and second transistor. The second transistor coupled to the output and a voltage source.

Coupling two level shifting buffers directly to an input and a voltage supply or another voltage input, allows a decision to be made at the level shifting buffer for switching the coupled transistor gate to an ON or OFF position. This circuit configuration using two level shifter and two transistors switches between two different voltage to output one of the two voltages while isolating one voltage from another which otherwise would not have been achieved using such few electrical components. In addition, the circuit configuration uses electrical component with no internal resistance drop, which increases the efficiency of the circuit.

An advantage of using a simple circuit with few electrical components for switching between two voltages is that a large amount of layout space is saved while maintaining same functionality. Since current trends in electrical applications are towards reducing power consumption, having fewer components reduces power consumption in the circuit by having a processor perform less operations.

The circuit also uses fewer level shifting buffers than the prior art. An advantage of using fewer level shifting buffers is that less level shifting buffers are coupled to pump output nodes. This results in reducing the leakage current in the circuit. Reduction of leakage current also leads to a longer refreshing time for the pumps and reduces the total standby current ICCS. Yet another advantage by reducing level shifting buffer usage is that die area is saved allowing electrical designers to implement newer switching schemes by using fewer components.

Figure 1:
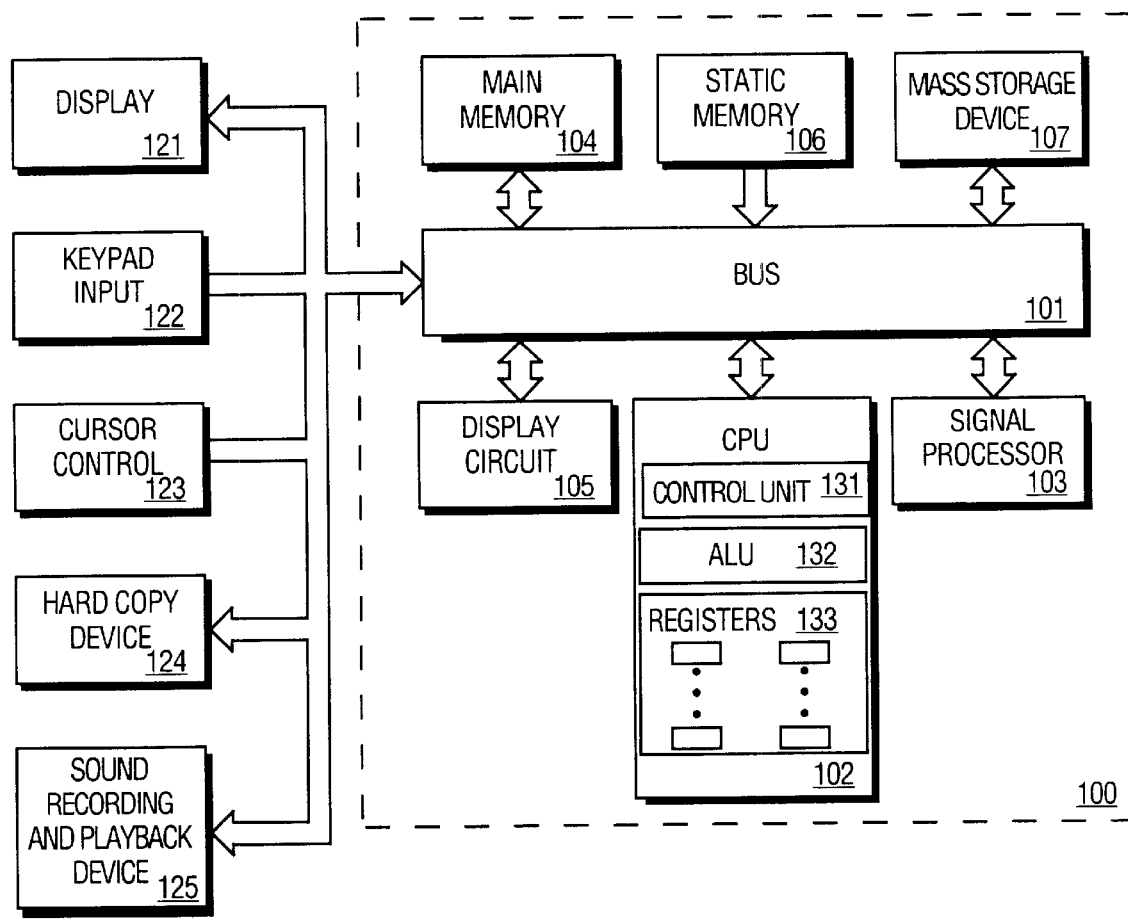
FIG. 1 shows an exemplary digital processing system in which the present invention can be implemented.

FIG. 1 shows an exemplary digital processing system 100 in which the present invention can be implemented. Referring to FIG. 1, digital processing system 100 includes a bus or other communication means 101 for communicating information, and a central processing unit (CPU) 102 coupled with bus 101 for processing information.

CPU 102 includes a control unit 131, an arithmetic logic unit (ALU) 132, and several registers 133, which are used to process information and signals. The circuit of the present invention for generating a very low voltage reference may be implemented within ALU 132. Furthermore, another processor 103 such as, for example, a coprocessor, can be coupled to bus 101 for additional processing power and speed.

Digital processing system 100 also includes a main memory 104, which may be a random access memory (RAM) or some other dynamic storage device that is coupled to bus 101 for storing information or instructions (program code), which are used by CPU 102 or processor 803. Main memory 104 may also be to store temporary variables or other intermediate information during execution of instructions by CPU 102 or processor 103. Digital processing system 100 also includes static memory 106, read only memory (ROM), and/or other static storage devices that are coupled to bus 101, for storing static information or instructions for CPU 102 or processor 103. A mass storage device 107 which may be a hard, floppy, or optical disk drive can be coupled to bus 101 for storing information and instructions for digital processing system 100.

A display 121 such as a cathode ray tube (CRT) or liquid crystal display (LCD) can be coupled to bus 101. Display device 121 displays information or graphics to a user. Digital processing system 100 can interface with display 121 via display circuit 105. A keyboard input 122, or other alphanumeric input device may also be coupled to bus 101 for communicating information and command selections to CPU 102. A cursor control 123 such as a mouse, a trackball, or cursor direction keys maybe coupled to bus 101 for controlling movement of an object on display 121. A hard copy device 124 such as a laser printer may be coupled to bus 101 for printing information on paper, film, or some other like medium. A number of input/output devices such as a sound recording and playback device 125 may also be coupled bus 101.

Figure 2:
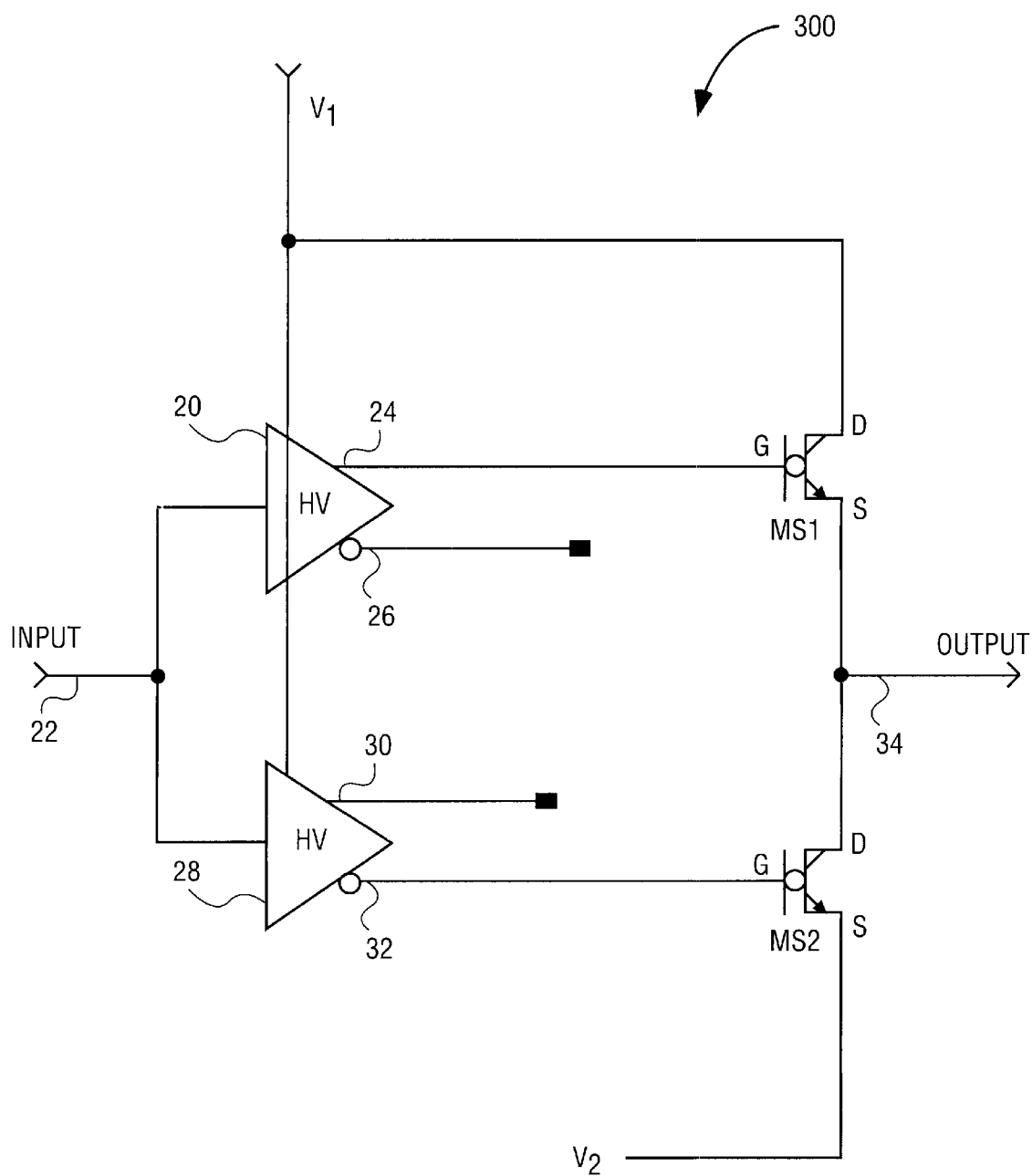
FIG. 2 shows a circuit for providing novel bi-voltage level switching according to one embodiment.

FIG. 2 shows a circuit 200 for providing novel bi-voltage level switching according to one embodiment. The circuit 200 includes two level shifting buffers and two switching devices. Circuit 200 may be a part of ALU 132 used by CPU 102.

Referring to FIG. 2, circuit 200 includes a first level shifting buffer 20 coupled to an input 22 for receiving a logic input signal, and a voltage supply "V1" for receiving a voltage supply signal. The first level shifting buffer 20 includes a non-inverting output terminal 24 and an inverting output terminal 26. The non-inverting output terminal 24 is coupled to a first voltage switching device "MS1". The inverting output terminal 26 is left open as an unused terminal. Alternatively, the inverting output terminal 26 is coupled to ground.

The first switching device MS1 is a Positive-Channel metal oxide semiconductor (PMOS) transistor MS1. Alternatively, the switching device may be a Negative-Channel metal oxide semiconductor (NMOS) device transistor or other type of circuitry that performs similar function. The gate of the transistor MS1 is coupled to the non-inverted output terminal 24 to receive a buffer signal produced by the first level shifting buffer 20. The drain of transistor MS1 is coupled to V1 to receive the voltage supply signal V1. V1 is also the power supply for circuit 200. The source of MS1 is coupled to output 34 and to transistor "MS2".

A second level shifting buffer 28 coupled to the input 22 for receiving the logic input signal, and to voltage supply V1 for receiving the voltage supply signal. The second level shifting buffer 28 includes a non-inverting output terminal 30 and an inverting output terminal 32. The non-inverting output terminal 30 is left open as an unused terminal. Alternatively, the non-inverting output terminal 30 is coupled to ground. The inverting output terminal 32 is coupled to a second voltage switching device MS2.

The second voltage switching device MS2 is a PMOS transistor. Alternatively, the switching device may be an NMOS transistor or other type of circuitry that performs similar function. The gate of transistor MS2 is coupled to the second level shifting buffer 28 to receive a buffer signal. The drain of transistor MS2 is coupled to the output 34 and to transistor MS1. The source of transistor MS2 is coupled to a voltage source "V2" to receive a voltage source signal. The voltage supply signal V1 has a higher voltage potential that the voltage source signal V2.

Figure 3:
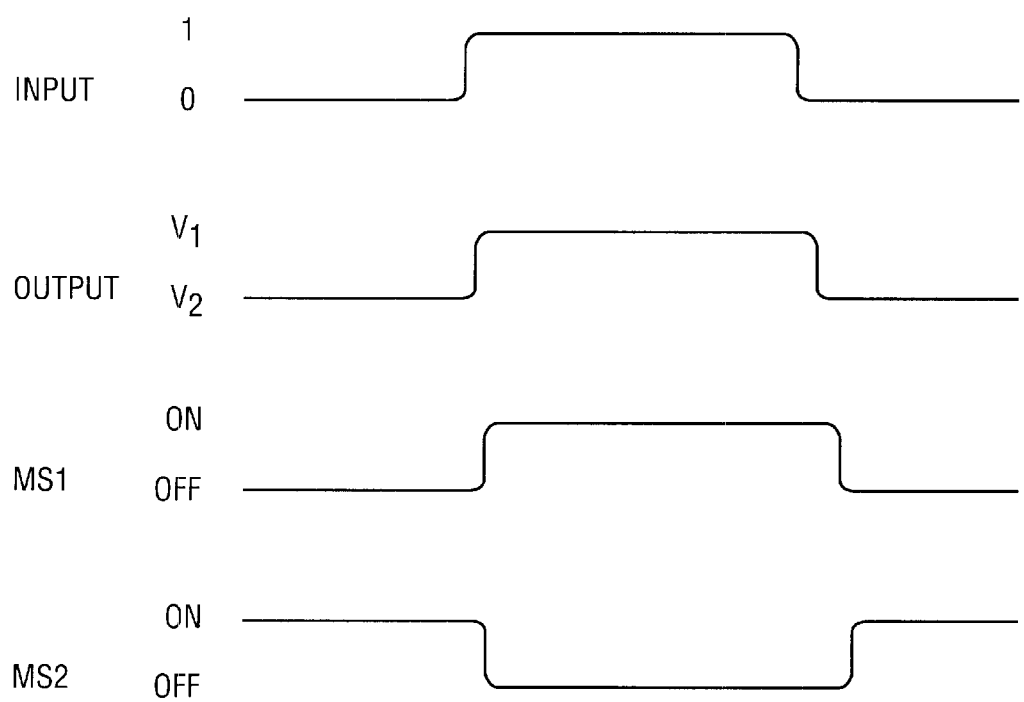
FIG. 3 shows a timing diagram for the circuit of FIG. 2 according to one embodiment.

FIG. 3 shows a timing diagram for the circuit of FIG. 2 according to one embodiment. Referring to FIG. 3, a logic input of a "1" or a "0" may be received at the input 22.

In one embodiment, the logic input received at input 22 is a "1". As discussed earlier, the first level shifting buffer 20 receives both the voltage supply signal V1 and the logic input from the input 22. For a logic output of "1" the first level shifting buffer 20 outputs the received voltage signal V1 as the buffer signal.

The gate of the first transistor MS1 receives the buffer signal with a voltage potential V1. The gate of the transistor MS1 has a voltage potential V1 and the source of transistor MS1 coupled to output has a voltage potential that is lower than voltage potential at the gate of MS1 or is 0V. A higher voltage potential at the gate and lower voltage potential at the source turns the transistor MS1 switch to the ON position. The ON switch allows the buffer signal carrying a voltage potential V1 to pass through the transistor to the output 34. Thus the voltage potential at output is V1 with an insignificant threshold voltage drop across the first transistor MS1.

As discussed earlier, the second level shifting buffer 28 receives both the voltage supply signal V1 and the logic input from the input 22. Since the second level shifting buffer 28 has its inverting output terminal 26 coupled to the second transistor MS2, the second level shifting buffer 28 outputs a buffer signal that has an inverted voltage potential value. An inverter included in the inverting output terminal 32 inverts the received logic input of "1" to an output of "0". For a logic output of "0", the first level shifting buffer 20 shifts the voltage potential of the received voltage supply signal V1 to output a buffer signal carrying a voltage potential of 0V.

The gate of the transistor MS2 receives the buffer signal with a voltage potential of 0V. The gate of transistor MS2 has a voltage potential of 0V and the source of transistor MS2 coupled to voltage source V2 has a voltage potential V2. A lower voltage potential at the gate and higher voltage potential at the source turns the transistor MS1 switch to the OFF position. The OFF switch does not allow any voltage to pass through the second transistor MS2. Therefore the voltage potential at output is V1.

In another embodiment, the logic input received at input 22 is a "0". For a logic output of "0", the first level shifting buffer 20 shifts the voltage potential of the received voltage supply signal V1 to output a buffer signal carrying a voltage potential of 0V.

The gate of the first transistor MS1 receives the buffer signal with a voltage potential of 0V. The gate of transistor MS1 has a voltage potential of 0V and the source of transistor MS2 coupled to output 34 has a voltage potential that is lower than voltage potential at gate of MS1 or is 0V. A voltage potential at the gate that is same or lower than voltage potential at the source turns the transistor MS1 switch is to the OFF position. The OFF switch does not allow any voltage to pass through the first transistor MS1.

The second level shifting buffer 28 receives both the voltage supply signal V1 and the logic input from the input 22. Since the second level shifting buffer has its inverting output terminal 32 coupled to the second transistor MS2, the second level shifting buffer 28 outputs a buffer signal that has an inverted voltage potential value. The inverter included in the inverting output terminal inverts the received logic input of "0" to an output of "1". For a logic output of "1", the voltage potential of the output buffer signal is V1.

The gate of the second transistor MS2 receives the buffer signal with a voltage potential of V1. The gate of transistor MS2 has a voltage potential of V1 and the source of transistor MS2 coupled to voltage source V2 has a voltage potential V2. Since the voltage potential at V1 is higher than voltage potential at V2, voltage potential at the gate of transistor MS2 is higher than voltage potential at the source of transistor MS1. A high voltage potential at gate and low voltage potential at source turns the transistor MS2 gate to the ON position. Thus the ON switch allows voltage V2 to pass through the second transistor to output 34. Therefor voltage potential at output is V2.

Figure 4:
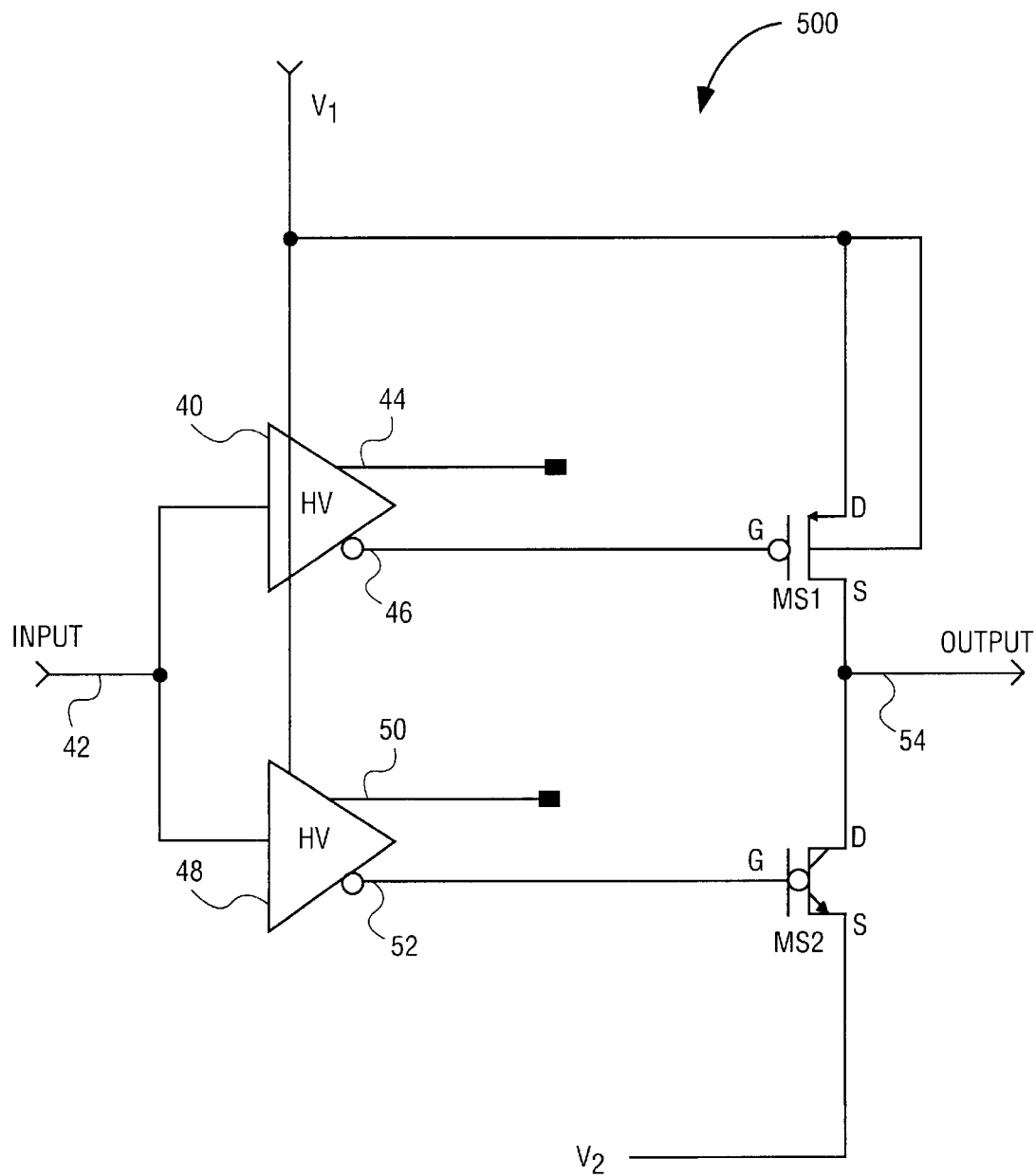
FIG. 4 shows a circuit for providing novel bi-voltage level switching according to one embodiment.

FIG. 4 shows a circuit 400 for providing novel bi-voltage level switching according to one embodiment. The circuit 400 includes two level shifting buffers and two switching devices. Circuit 400 may be a part of ALU 132 used by CPU 102.

Referring to FIG. 4, circuit 400 includes a first level shifting buffer 40 coupled to an input 42 for receiving a logic input signal, and a voltage supply V1 for receiving a voltage supply signal V1. The first level shifting buffer 40 includes a non-inverting output terminal 44 and an inverting output terminal 46. The non-inverting output terminal 44 is left open as an unused terminal. Alternatively, the non-inverting output terminal is coupled to ground. The inverting output terminal 46 is coupled to the gate of first switching device MS1.

The first switching device MS1 is a P-Type transistor MS1. A P-type transistor does not have any internal resistance and acts as an on/off switch. Alternatively, the switching device may be an NMOS transistor or other type of circuitry that performs similar function.

The drain and gate of transistor MS1 is coupled to voltage source V1 to receive the first voltage input signal V1. This configuration allows a V1 to pass through the P device if the gate is in the ON position without incurring any internal resistance drop. The gate of the transistor MS1 is coupled to the first level shifting buffer 40 to receive a buffer signal. The drain of MS1 is coupled to output 54 and to transistor MS2.

A second level shifting buffer 48 is coupled to the input 42 for receiving the logic input signal, and to voltage source V1 to receive the first voltage signal V1. The second level shifting buffer 48 includes a non-inverting output terminal 50 and an inverting output terminal 52. The non-inverting output terminal 50 is left open as an unused terminal. Alternatively, the non-inverting output terminal 50 is coupled to ground. The inverting output terminal 52 is coupled to a second voltage switching device MS2.

The second voltage switching device MS2 is a PMOS transistor. Alternatively, the switching device may be an NMOS transistor or other type of circuitry that performs similar function. The gate of MS2 is coupled to the second level shifting buffer 48 to receive a buffer signal. The drain of transistor MS2 is coupled to the output 54 and to transistor MS1. The source of transistor MS2 is coupled to voltage source V2 to receive a source voltage signal. Voltage supply signal V1 has a higher voltage potential than voltage source signal V2.

Figure 5:
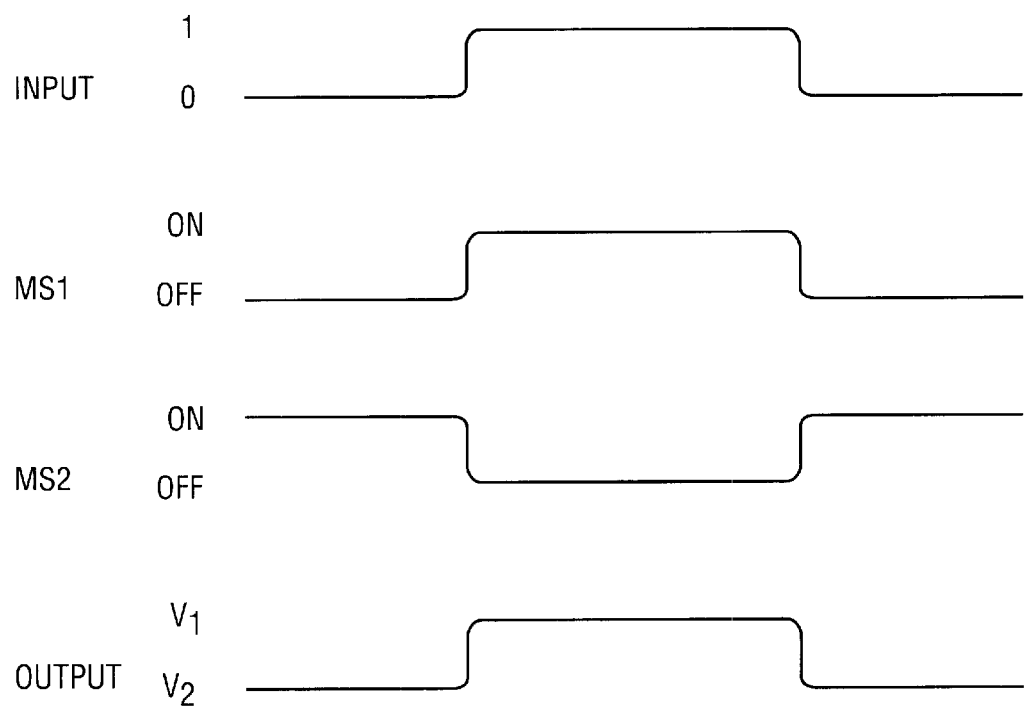
FIG. 5 shows a timing diagram for the circuit of FIG. 4 according to one embodiment.

FIG. 5 shows a timing diagram for the circuit of FIG. 4 according to one embodiment. Referring to FIG. 5, a logic input of a "1" or a "0" may be received at the input 42.

In one embodiment, the logic input received at input 42 is a "1". As discussed earlier, the first level shifting buffer 40 receives both the voltage supply signal and the logic input from the input 42.

Since the first level shifting buffer 48 has its inverting output terminal 46 coupled to the transistor MS1, the first level shifting buffer 48 outputs a buffer signal that has an inverted voltage potential value. The inverter included in the inverting output terminal inverts the received logic input of "1" to an output of "0". For a logic output of "0" the level shifting buffer 40 shifts the voltage potential of the received voltage supply signal V1 to output a buffer signal carrying a voltage potential of 0V.

The gate of the first transistor MS1 receives the buffer signal with a voltage potential of 0V. The gate of the transistor MS1 has a voltage potential 0V and drain of transistor MS1 coupled to voltage source V1 has a voltage potential of V1.

In a P-Type transistor, a gate is switched to an ON position if the voltage potential at drain is higher than the voltage potential at the gate. Since the voltage potential at the drain is higher voltage potential at the gate, the transistor MS1 switch is turned to the ON position. The ON switch allows voltage potential V1 to directly pass across transistor MS1 to the output 54. Since the P-type transistor configuration doesn't have internal resistance, there is no internal resistance drop for V1.

As discussed earlier, the second level shifting buffer 48 receives both the voltage supply signal and the logic input from the input 42. Since the second level shifting buffer 48 has its inverting output terminal 52 coupled to the second transistor MS2, the second level shifting buffer 48 outputs a buffer signal that has an inverted voltage potential value. An inverter included in the inverting output terminal 52 inverts the received logic input of "1" to an output of "0". For a logic output of "0", the voltage potential of the output buffer signal is switched from V1 to 0V.

The gate of the transistor MS2 receives the buffer signal with a voltage potential of 0V. The gate of transistor MS2 has a voltage potential of 0V and the source of transistor MS2 coupled to voltage source V2 has a voltage potential V2. A lower voltage potential at the gate and higher voltage potential at the source turns the transistor MS2 switch to the OFF position. Thus the OFF switch does not allow any voltage to pass through transistor MS2.

In another embodiment, the logic input received at input 42 is a "0". The inverter included in the inverting output terminal 46 of the first level shifting buffer inverts the received logic input of "0" to an output of "1". For a logic output of "1" the voltage potential of the output buffer signal is V1.

The gate of the first transistor MS1 receives the buffer signal with a voltage potential of V1. The gate of transistor MS1 has a voltage potential of V1 and the drain of transistor MS2 coupled to voltage supply V1 has a voltage potential of V1. A same voltage across drain and gate of transistor MS1 turns the transistor switch to the OFF position allowing any voltage to pass through transistor MS1.

The second level shifting buffer 48 receives both the voltage supply signal and the logic input from the input 42. Since the second level shifting buffer has its inverting output terminal 46 coupled to the second transistor MS2, the second level shifting buffer 48 outputs a buffer signal that has an inverted voltage potential value. The inverter included in the inverting output terminal inverts the received logic input of "0" to an output of "1". For a logic output of "1" the voltage potential of the output buffer signal is V1.

The gate of the second transistor MS2 receives the buffer signal with a voltage potential of V1. The voltage potential at the gate of MS2 is V1. Since the voltage potential at the gate of transistor MS2 is higher than the source which is coupled to voltage source V2, the transistor MS2 switch is turned to the ON position. Thus the ON switch allows voltage V2 to pass through the second transistor to output 34.

Figure 6:
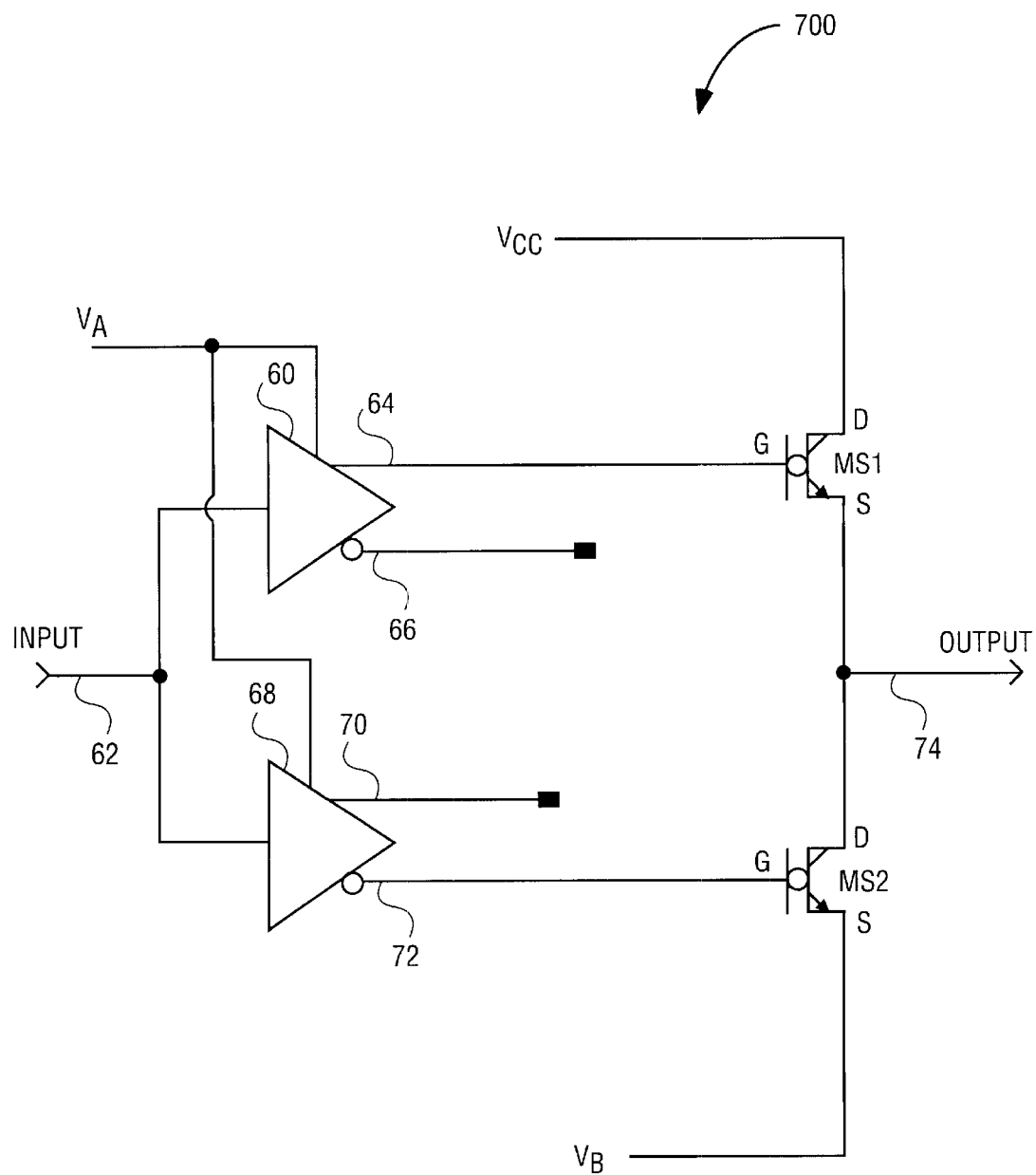
FIG. 6 shows a circuit for providing novel bi-voltage level switching according to one embodiment.

FIG. 6 shows a circuit 600 for providing novel bi-voltage level switching according to one embodiment. The circuit 600 includes two level shifting buffers and two switching devices. The switching devices are PMOS transistors. Alternatively, the switching device may be an NMOS transistor or any other type of circuitry that performs similar function. Circuit 600 may be a part of ALU 132 used by CPU 102.

Referring to FIG. 6, circuit 600 includes a first level shifting buffer 60 coupled to an input 62 for receiving a logic input signal, and a voltage source "VA" for receiving the first voltage source signal. The first level shifting buffer 60 includes a non-inverting output terminal 64 and an inverting output terminal 66. The non-inverting output terminal 64 is coupled to the gate of transistor MS1 to send a buffer signal. The inverting output terminal 66 is left open as an unused terminal. Alternatively, the non-inverting output terminal is coupled to ground.

The drain of transistor MS1 is coupled to voltage source Vcc. Vcc is the power supply voltage for circuit 600 and has a voltage potential that is higher than voltage potential at VA. The gate of the transistor MS1 is coupled to the non-inverted output terminal 64 of the first level shifting buffer 60 to receive a buffer signal. The source of MS1 is coupled to output 74 and to transistor MS2.

A second level shifting buffer 68 is coupled to the input 62 for receiving the logic input signal, and to voltage source VA for receiving the voltage signal VA. The second level shifting buffer 68 includes a non-inverting output terminal 70 and an inverting output terminal 72. The non-inverting output terminal 70 is left open as an unused terminal. Alternatively, the non-inverting output terminal is coupled to ground. The inverting output terminal 72 is coupled to the gate of transistor MS2 to send a buffer signal produced by the second level shifting buffer 68.

The drain of transistor MS2 is coupled to the output 74 and to transistor MS1. The source of MS2 is coupled to a second voltage source VB to receive a second voltage signal. The voltage signal VA has a higher voltage potential than voltage potential at voltage signal VB. Voltage supply signal Vcc also has a higher voltage potential than voltage potential at voltage signal VB.

Figure 7:
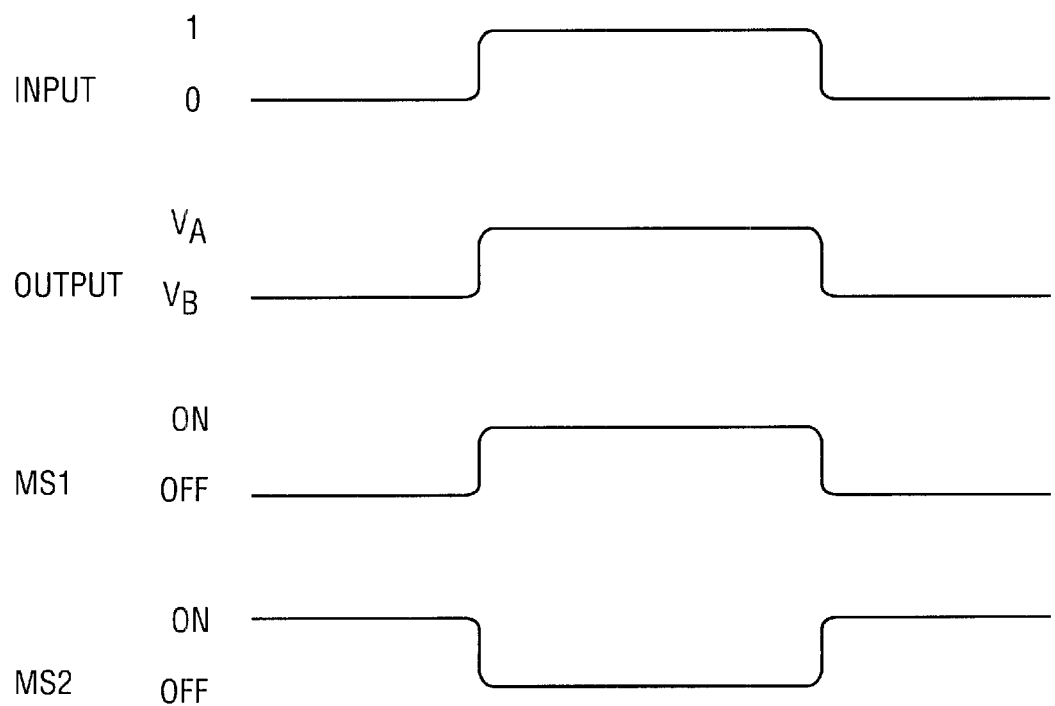
FIG. 7 shows a timing diagram for the circuit of FIG. 6 according to one embodiment.

FIG. 7 shows a timing diagram for the circuit of FIG. 6 according to one embodiment. Referring to FIG. 7, a logic input of a "1" or a "0" may be received at the input 62.

In one embodiment, the logic input received at input 62 is a "1". As discussed earlier, the first level shifting buffer 60 receives both the voltage source signal VA and the logic input from the input 62. For a logic output of "1" the first level shifting buffer 60 outputs the received voltage source signal VA as the buffer signal.

The gate of the first transistor MS1 receives the buffer signal with a voltage potential VA. The gate of the transistor MS1 has a voltage potential VA and the source of transistor MS1 coupled to output has a voltage potential that is lower than voltage potential at the gate of MS1 or is at 0V. A higher voltage potential at the gate of transistor MS1 and a lower voltage potential at the source of transistor MS1 turns the transistor MS1 gate to the ON position. The ON switch allows the buffer signal carrying a voltage potential VA to pass through the transistor to the output 74. Thus the voltage potential at output is VA with an insignificant threshold voltage drop across the first transistor MS1.

As discussed earlier, the second level shifting buffer 68 receives both the voltage source signal VA and the logic input from the input 62. Since the second level shifting buffer 68 has its inverting output terminal 72 coupled to the second transistor MS2, the second level shifting buffer 68 outputs a buffer signal that has an inverted value. An inverter included in the inverting output terminal 72 inverts the received logic input of "1" to an output of "0". For a logic output of "0", the voltage potential of the output buffer signal is switched from VA to 0V.

The gate of the transistor MS2 receives the buffer signal with a voltage potential of 0V. The gate of transistor MS2 has a voltage potential of 0V and the source of transistor MS2 coupled to voltage source VB has a voltage potential VB. A lower voltage potential at the gate and higher voltage potential at the source turns the transistor MS1 switch to the OFF position. Thus the OFF switch does not allow any voltage to pass through the second transistor MS2.

In another embodiment, the logic input received at input 62 is a "0". For a logic output of "0", the first level shifting buffer 60 shifts the voltage potential of the received voltage supply signal VA to output a buffer signal carrying a voltage potential of 0V.

The gate of transistor MS1 has a voltage potential of 0V. A voltage potential at the gate being the same or lower that voltage potential at the source turns the gate to an OFF position. The OFF switch does not allow any voltage to pass through MS1. Therefor the voltage potential at output is V1.

The second level shifting buffer 68 receives both the voltage source signal VA and the logic input signal from the input 62. Since the second level shifting buffer has its inverting output terminal 72 coupled to the second transistor MS2, the second level shifting buffer 68 outputs a buffer signal that has an inverted voltage potential value. The inverter included in the inverting output terminal 72 inverts the received logic input of "0" to output of "1". For a logic output of "1" the voltage potential of the output buffer signal is VA.

The gate of the second transistor MS2 receives the buffer signal with a voltage potential of VA. The gate of the second transistor MS2 has a voltage potential of VA and the source of transistor MS2 coupled to voltage source VB has a voltage potential of VB. Since voltage potential of voltage signal VA is higher than VB, the voltage potential at the gate of transistor MS2 is higher than the source of transistor MS2. A higher voltage potential at the gate and a lower voltage potential at the source turns the gate to an ON position. The ON switch allows voltage VB to pass through the second transistor to output 74 without any internal resistance drop. Thus the voltage potential at output 74 is the VB.

These and other embodiments of the present invention may be realized in accordance with these teachings and it should be evident that various modifications and changes may be made in these teachings without departing from the broader spirit and scope of the invention. The specification and drawings are, accordingly, to be regarded in an illustrative rather than restrictive sense and the invention measured only in terms of the claims.

What is claimed is:

1. An apparatus comprising:
 a first level shifting buffer coupled to a voltage supply, an input, and a first transistor, the first transistor coupled to the voltage supply and an output; and
 a second level shifting buffer coupled to the voltage supply, the input and second transistor, the second transistor coupled to the output and a voltage source;
 the first level shifting buffer having a non-inverted output terminal coupled to the gate of the first transistor, and an inverted output terminal.

2. An apparatus comprising:
 a first level shifting buffer coupled to a voltage supply, an input, and a
 first transistor, the first transistor coupled to the voltage supply and an output; and
 a second level shifting buffer coupled to the voltage supply, the input and second transistor, the second transistor coupled to the output and a voltage source;

the first level shifting buffer having an inverted output terminal coupled to the gate of the first transistor, and a non-inverted output terminal.

3. The apparatus of claim 1, wherein the first transistor is a Positive-Channel metal oxide semiconductor (PMOS) device with its drain coupled to the voltage supply and source coupled to the output.

4. The apparatus of claim 2, wherein the first transistor is a Negative-Channel metal oxide semiconductor (NMOS) device with its drain coupled to the voltage supply and source coupled to the output.

5. The apparatus of claim 1, wherein the second level shifting buffer further includes an inverted output terminal coupled to the gate of the second transistor, and a non-inverted output terminal.

6. The apparatus of claim 2, wherein the second level shifting buffer further includes a non-inverted output terminal coupled to the gate of the second transistor, and an inverted output terminal.

7. The apparatus of claim 1, wherein the second transistor is a Positive-Channel metal oxide semiconductor (PMOS) device with its drain coupled to the output, and source coupled to the voltage source.

8. The apparatus of claim 1, wherein the second transistor is a Negative-Channel metal oxide semiconductor (NMOS) device with its drain coupled to the output and source coupled to the voltage source.

9. The apparatus of claim 1, wherein the first transistor and second transistor are in series.

10. The apparatus of claim 1, wherein the voltage potential at the voltage supply is higher than the voltage potential at the voltage source.

11. An apparatus comprising:
a first level shifting buffer coupled to a first voltage source, an input, and
a first transistor, the first transistor coupled to a voltage supply and an output; and
a second level shifting buffer coupled to the first voltage source, the input and a second transistor, the second transistor coupled to the output and a second voltage source;
the first level shifting buffer having a non-inverted output terminal coupled to the gate of the first transistor, and an inverted output terminal.

12. The apparatus of claim 11, wherein the voltage potential at the first voltage source is higher than the voltage potential at the second voltage source.

13. The apparatus of claim 11, wherein the voltage potential at the voltage supply is higher than the voltage potential at the second voltage source.

14. The apparatus of claim 11, wherein the voltage potential at the voltage supply is higher than the voltage potential at the first voltage source.

15. The apparatus of claim 11, wherein the second level shifting buffer further includes an inverted output terminal coupled to the gate of the second transistor, and a non-inverted output terminal.

16. The apparatus of claim 11, wherein the first transistor and second transistor are in series.

17. The apparatus of claim 11, wherein the drain of the first transistor is coupled to the voltage supply and source is coupled to the output.

18. The apparatus of claim 11, wherein the drain of the second transistor is coupled to the output, and the source is coupled to the second voltage source.

19. A circuit comprising:
a first level shifting buffer coupled to a voltage supply, an input, and a first transistor, the first transistor coupled to the voltage supply and an output; and
a second level shifting buffer coupled to the voltage supply, the input and second transistor, the second transistor coupled to the output and a voltage source;
the first level shifting buffer having a non-inverted output terminal coupled to the gate of the first transistor, and an inverted output terminal.

20. A circuit comprising:
a first level shifting buffer coupled to a voltage supply, an input, and a first transistor, the first transistor coupled to the voltage supply and an output; and
a second level shifting buffer coupled to the voltage supply, the input and second transistor, the second transistor coupled to the output and a voltage source;
the first level shifting buffer having an inverted output terminal coupled to the gate of the first transistor, and a non-inverted output terminal.

21. A circuit comprising:
a first level shifting buffer coupled to a first voltage source, an input, and
a first transistor, the first transistor coupled to a voltage supply and an output; and
a second level shifting buffer coupled to the first voltage source, the input and a second transistor, the second transistor coupled to the output and a second voltage source;
the first level shifting buffer having a non-inverted output terminal coupled to the gate of the first transistor, and an inverted output terminal.

22. The circuit of claim 21, wherein the voltage potential at the first voltage source is higher than the voltage potential at the second voltage source.

23. The circuit of claim 21, wherein the voltage potential at the voltage supply is higher than the voltage potential at the second voltage source.

24. A digital processing system comprising:
a memory; and
a processor coupled to said memory to use a first level shifting buffer coupled to a voltage supply, an input and a first transistor to receive a voltage supply signal, an input signal and to send a buffer signal, to use the first transistor coupled to the voltage supply, first level shifting buffer, and an output to receive the voltage supply signal, the buffer signal and to output an output signal based on the buffer signal, to use a second level shifting buffer coupled to the voltage supply, the input and a second transistor, to receive the voltage supply signal, the input signal and to output an output signal, and to use the second transistor coupled to the second level shifting buffer, a voltage source and the output to receive a buffer signal, a voltage source signal from the voltage source, and to output an output signal based on the received buffer signal, the first level shifting buffer having a non-inverted output terminal coupled to the gate of the first transistor, and an inverted output terminal.

25. The digital processing system of claim 24, wherein the voltage supply signal has a higher voltage potential than the voltage source signal.

26. A method comprising:
coupling a first level shifting buffer to a first voltage supply, an input, and a first transistor;
coupling a second level shifting buffer to said first voltage supply, said input and a second transistor;
coupling said first transistor to a second voltage supply and an output;

coupling said second transistor to said output and voltage source; and coupling a non-inverted output terminal of said first level shifting buffer to a gate of said first transistor wherein the voltage potential at the second voltage supply is higher than the voltage potential at the first voltage supply.

27. A method comprising:

coupling a first level shifting buffer to a first voltage supply, an input, and a first transistor;

coupling a second level shifting buffer to said first voltage supply, said input and a second transistor;

coupling said first transistor to a second voltage supply and an output;

coupling said second transistor to said output and voltage source; and coupling an inverted output terminal of said first level shifting buffer to a gate of said first transistor wherein the voltage potential at the second voltage supply is higher than the voltage potential at the first voltage supply.

28. The method according to claim 26, wherein coupling said first transistor further comprises:

coupling a drain of said first transistor to said voltage supply; and coupling a source of said first transistor of said output.

29. The method according to claim 28, wherein said first transistor is a Positive-Channel metal oxide semiconductor (PMOS) device.

30. The method according to claim 28, wherein said first transistor is a Negative-Channel metal oxide semiconductor (NMOS) device.

31. The method according to claim 26, wherein coupling said second level shifting buffer further comprises:

coupling an inverted output terminal of said second level shifting buffer to a gate of said second transistor.

32. The method according to claim 27, wherein coupling said second level shifting buffer further comprises:

coupling an inverted output terminal of said second level shifting buffer to a gate of said second transistor.

33. The method according to claim 26, wherein coupling said second transistor further comprises:

coupling a drain of said second transistor to said output; and coupling a source of said second transistor to said voltage source.

34. The method according to claim 26, wherein a voltage supply potential of said voltage supply is higher than a voltage source potential of said voltage source.

35. A method comprising:

coupling a first level shifting buffer to a first voltage source, an input, and a first transistor;

coupling a second level shifting buffer to said first voltage source, said input, and second transistor;

coupling said first transistor to a voltage supply and an output;

coupling said second transistor to said output and a second voltage source; and coupling a non-inverted output terminal of said first level shifting buffer to a gate of said first transistor wherein the voltage potential at the voltage supply is higher than the voltage potential at the first voltage source.

36. The method according to claim 35, wherein said second level shifting buffer further comprises:

coupling an inverted output terminal of said second level shifting buffer to a gate of said second transistor.

37. The method according to claim 35, wherein coupling said first said transistor further comprises:

coupling a drain of said first transistor to said voltage supply; and coupling a source of said first transistor to said output.

38. The method according to claim 35, wherein coupling said second transistor further comprises:

coupling a drain of said second transistor to said output; and coupling a source of said second transistor to said second voltage source.

39. The method according to claim 35, wherein a first voltage source potential of said first voltage source is higher than a second voltage source potential of said second voltage source, and a voltage supply potential of said voltage supply is higher than said second voltage source potential.

* * * * *